United States Patent
Nakamoto et al.

(10) Patent No.: US 7,047,093 B2
(45) Date of Patent: May 16, 2006

(54) SEMICONDUCTOR MANUFACTURING APPARATUS AND ITS DIAGNOSIS APPARATUS AND OPERATING SYSTEM

(75) Inventors: Shigeru Nakamoto, Kudamatsu (JP); Hideaki Kondo, Kudamatsu (JP); Juntaro Arima, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 10/689,594

(22) Filed: Oct. 22, 2003

(65) Prior Publication Data

US 2004/0078946 A1    Apr. 29, 2004

Related U.S. Application Data

(63) Continuation of application No. 10/083,254, filed on Feb. 27, 2002, now Pat. No. 6,901,306.

(51) Int. Cl.
   *G06F 19/00* (2006.01)
(52) U.S. Cl. .................... 700/95; 700/109; 700/117; 702/84
(58) Field of Classification Search ............... 700/1, 700/90, 121, 108, 109, 95, 117; 702/84
   See application file for complete search history.

(56) References Cited

U.S. PATENT DOCUMENTS

| | | | |
|---|---|---|---|
| 4,442,402 A * | 4/1984 | Besomi et al. ............... 324/767 |
| 4,964,734 A | 10/1990 | Yoshida et al. |
| 5,440,478 A | 8/1995 | Fisher et al. |
| 6,487,472 B1 | 11/2002 | Song et al. |
| 6,535,774 B1 | 3/2003 | Bode et al. |
| 6,673,547 B1 * | 1/2004 | Hirabayashi et al. ......... 435/6 |
| 2002/0035447 A1 | 3/2002 | Takahashi et al. |
| 2002/0123816 A1 * | 9/2002 | Tanaka et al. ............... 700/108 |

FOREIGN PATENT DOCUMENTS

| | | |
|---|---|---|
| JP | 07-282146 | 10/1995 |
| JP | 10-21079 | 1/1998 |

* cited by examiner

*Primary Examiner*—Jayprakash N. Gandhi
(74) *Attorney, Agent, or Firm*—Antonelli, Terry, Stout and Kraus, LLP.

(57) ABSTRACT

A sample processing apparatus having a main unit for processing a sample, a recorder for recording information of an operation in the main unit as predetermined data, which information includes a plurality of data corresponding to outputs of a plurality of sensors installed on the main unit, and a display unit for displaying each of the data corresponding to outputs of the sensors simultaneously.

27 Claims, 10 Drawing Sheets

| ID | Atr | Byte | bit | Value | Name | Condition |
|---|---|---|---|---|---|---|
| 31 | DO | 3 | 6 | 0 | LP1 READY | |
| 34 | DO | 4 | 1 | 0 | LP1 HO-AVBL SMIF1 Ready to UL | |
| 32 | DO | 3 | 7 | 0 | LP1 ES | |
| 35 | DO | 4 | 2 | 0 | LP1 LREQ    SMIF1 Port Lock | |
| 33 | DO | 4 | 0 | 0 | LP1 UREQ    SMIF1 Load/Unload | |

| ID | Atr | Byte | bit | Value | Name | Condition |
|---|---|---|---|---|---|---|
| 415 | DI | 5 | 6 | 0 | LP1 TR REQ | |
| 414 | DI | 5 | 5 | 0 | LP1 CS2 | |
| 409 | DI | 5 | 0 | 0 | LP1 BUSY | |
| 416 | DI | 5 | 7 | 0 | LP1 CONT | |
| 410 | DI | 5 | 1 | 0 | LP1 COMPT | |
| 413 | DI | 5 | 4 | 0 | LP1 CS1 | |
| 412 | DI | 5 | 3 | 0 | LP1 CS0 | |
| 411 | DI | 5 | 2 | 0 | LP1 VALID | |

SEMICONDUCTOR MANUFACTURING APPARATUS AND ITS DIAGNOSIS APPARATUS AND OPERATING SYSTEM

CROSS REFERENCE TO RELATED APPLICATION

This is a continuation of U.S. application Ser. No. 10/083,254, filed Feb. 27, 2002, now U.S. Pat. No. 6,901,306, the subject matter of which is incorporated by reference herein.

BACKGROUND OF THE INVENTION

The present invention relates to a semiconductor manufacturing apparatus, its diagnosis apparatus and operating system which are arranged to maintain the semiconductor manufacturing apparatus, and a method of manufacturing a semiconductor.

The semiconductor manufacturing apparatus has traditionally given an alarm to an operator of the apparatus with beeps on communication arrangements, a section for managing the apparatus itself or the like if the apparatus suffers from an error or an unfavorable condition. Moreover, the occurrence of an abnormal condition like an error is reported to a manufacturer or a supplier of the apparatus, an enterprise of diagnosing or operating the apparatus, or an enterprise of supplying such services. In response to the alarm, the operator or engineer of the apparatus searches the information on the abnormal condition reported thereto, checks for the apparatus, and repairs it if possible.

In place, if the abnormal condition (often referred to as an abnormality) concerns with a quite significant portion or a portion where the highly technical knowledge is necessary to the check, the skilled person belonging to the foregoing enterprise or special section comes to the place where the apparatus is installed for checking therefor. Then, the skilled person reports the result to the responsible section of the manufacturer or diagnosing or operating the apparatus. In response, the skilled person repairs the apparatus according to the process and the measures determined on the result reported therefrom.

However, the places where the semiconductor manufacturing apparatus are scattered anywhere domestic or worldwide. Under this circumstance, in some cases, a considerably long distance between the places requires the skilled persons belonging to the diagnosis or operating section to take so long a time in moving from one place to another that the quick response to the alarm cannot be substantially supplied to the buyers or users of the apparatus. Also, a considerably long distance between the buyer or user of the apparatus, the section of supplying a service like a maintenance, and the manufacturing place brings about a difficulty in quickly responding to the alarm reported from the place where the semiconductor manufacturing apparatus is installed.

Further, in the apparatus installed place, these skilled persons have difficulty in properly responding to the abnormality, because when they come to the place, at least the time taken in moving them from their place to the apparatus installed place is passed so that the state of the apparatus cannot be precisely determined. Further, the skilled persons also have difficulty in reporting the detailed state of the apparatus to the section in charge of designing or manufacturing the apparatus through the communication arrangement. The rough, that is, often inaccurate information on the state of the apparatus does not easily allow the approximate response to the abnormality to be provided to the skilled persons located nearby the apparatus.

In order to overcome these difficulties, the concerned technology has been devised wherein the information on an abnormality like an error, a failure or a trouble occurring in the apparatus is reported from the apparatus side through a communication arrangement located therebetween and the proper response to the abnormality is reported back to the apparatus side. This type of technology is disclosed in JP-A-7-282146 (First Prior Art) or JP-A-10-21079 (Second Prior Art). These prior arts are arranged to report the information of an abnormality like an error and to report back the measures determined on the information through a network like a LAN (Local Area Network) served as the communicating arrangement.

The first prior art (JP-A-7-282146) is arranged to detect an operating timing of each unit inside the apparatus through the use of a detector like a wafer sensor or a pitch sensor, determine an abnormality occurs if the detected timing is out of the allowable range, and then report an alarm to a computer for managing the apparatus. Further, the computer is connected to a workstation through the communicating arrangement (network), the workstation having an expert system operated thereon. In response to an alarm including the number and the abnormality code of an I/O where the abnormality is detected, the expert system operates to transmit the specific method of responding to the malfunctional portion to the computer of managing the apparatus as the diagnosed result and then display the pairs of the failure candidates and the responding methods thereto on the display unit.

Further, the second prior art (JP-A-10-21079) concerns with the failure diagnosing apparatus in which if an abnormal state occurs in a semiconductor manufacturing apparatus, an alarm code having a predetermined data format is reported to a computer in charge of diagnosing the semiconductor manufacturing apparatus through a communication network. This computer stores the rules of inferring the causes of the abnormality and the responding methods thereto from the reported alarm codes. On these rules, the computer infers the cause of the reported abnormality and its measures from the alarm code. Then, the display provided in the diagnosing apparatus operates to display the corresponding message to the diagnosed result.

The foregoing prior arts are both arranged to connect the semiconductor manufacturing apparatus with a computer for diagnosing this apparatus for an abnormality through the communicating arrangement (LAN) and report the abnormality through the communicating arrangement if it occurs. Then, this computer operates to analyze the cause of the abnormality and its concerned portion, operate the measures for the abnormality, and selectively outputting the measures. This diagnosed result is transmitted to the display unit or the semiconductor manufacturing apparatus on the side of which it is displayed on the display unit.

However, the foregoing prior arts are arranged so that the computer may compute the state and the cause of the abnormality. Hence, the diagnosis of the abnormality is executed on the predetermined rules stored in the computer. It means that these prior arts do not take into consideration the provision of the information on the apparatus so that the skilled personnel in charge of the concerned apparatus may easily grasp and determine the state of the apparatus and the cause of the abnormality.

In order to execute the foregoing diagnosis through the computer, the storage unit located in the computer is required to systematically store the knowledge on the relation between the symptom and the cause of the abnormality so that the knowledge may be reused at any time. The obtaining and the systematic storage of the knowledge are required to accumulate the experiences and the knowledge of the skilled engineers and the service personnels. Moreover, the knowledge required to determine each cause of the abnormality according to the specification of the operation and the procedure are also requested to be accumulated as the semiconductor manufacturing apparatus is being promoted. The accumulative obtaining of such a knowledge normally needs a long time. In order to obtain such a knowledge, it is necessary to supply means of providing the information on the apparatus so that the personnels in charge of checking the apparatus may obtain the precise knowledge on the operation and the process of each type of semiconductor manufacturing apparatus. Further, if the abnormality is detected, the apparatus is stopped or its operation is restricted. This condition needs to improve the working efficiency of the apparatus. This thus requests to obtain the knowledge required to determine the cause of the abnormality for a short time. These are not considered in the foregoing prior arts.

In general, the semiconductor manufacturing apparatus needs a plurality of operations of the apparatus for processing the raw materials. It means that there may be other causes than the operation being executed when the abnormality occurs is a direct cause. Specifically, in the semiconductor manufacturing apparatus constructed to process the raw materials through the use of a plurality of gases and working materials, the cause on which the abnormality occurs in the apparatus may be often ascribed to the mutual relation of the operations being executed in the apparatus. In such a semiconductor manufacturing apparatus, it is preferable that the informations of not only a single operation but also the relation of plural operations may be used for determining the cause of the abnormality. In order to precisely the cause of the abnormality, it is important to estimate how significantly each operation of the apparatus has an effect on the apparatus. Likewise, if a plurality of operations being serially executed have an effect on the abnormality, the sensor may often sense the abnormality of only a single operation being executed for a short time and display it. In this case, it is difficult to precisely determine the cause of the abnormality.

In consideration of the aforementioned respects, the foregoing prior arts do not take into consideration means of providing information so that the user may easily determine the state of the apparatus and the cause of the abnormality. Hence, the user cannot precisely determine the cause and the state of the abnormality taking place in the apparatus, which leads to increasing the time when the apparatus is stopped and repaired and thereby lowering the operativity of the apparatus and increasing the manufacturing cost of the semiconductors.

Further, in order to more precisely determine the cause of the abnormality taking place in the semiconductor manufacturing apparatus or determine the state of the apparatus where the abnormality occurs, it is preferable to check the apparatus as the apparatus is actually operated in the condition where the abnormality occurs. However, in a case that the apparatus is stopped in response to the report on the occurrence of the abnormality, it is difficult to operate the apparatus again. Even if it is possible, it is difficult to reproduce the same condition as the condition where the reported abnormality occurs. This difficulty makes it impossible to precisely check the operation of the apparatus, which disadvantageously results in impairing the precise determination of the abnormality cause.

In a case that the section in charge of maintaining and repairing the apparatus is located remotely from the place where the apparatus is installed, while the personnels in charge of checking the apparatus is moving to the place, the apparatus cannot be worked normally. If the section or the personnels in charge of maintaining or repairing the apparatus is located remotely, the cause of the abnormality of the apparatus cannot be properly determined for a short time, which leads to lowering the working efficiency of this apparatus, thereby disadvantageously increasing the manufacturing cost of the semiconductor.

As described above, no consideration is taken into the means of allowing the user to precisely grasp and specify the state of the abnormality-caused apparatus and the cause of the abnormality for a short time.

The foregoing prior arts thus need a long time until the cause of the abnormality is specified, so that the apparatus cannot be efficiently promoted. For shortening the time, it is possible to take the measures therefor such as location of the section in charge closer to the place where the apparatus is installed and distribution of the personnels in charge of maintenance and repair to each apparatus. However, these measures make the cost of the personnels in charge increase and thereby the operating efficiency of the apparatus inferior. It means that the foregoing prior arts do not sufficiently consider the means or system required to efficiently promote the semiconductor manufacturing apparatus where the abnormality occurs. In particular, no consideration is taken into the efficient promotion of a group of these apparatuses in a place like a factory where a plurality of apparatuses are installed.

SUMMARY OF THE INVENTION

It is an object of the present invention to provide a semiconductor manufacturing apparatus and its diagnosis apparatus which are arranged so that the user can precisely determine the state of the apparatus and the cause of the abnormality for a short time.

It is a further object of the present invention to provide a semiconductor manufacturing apparatus and its diagnosis apparatus which are arranged so that if the user is remote from the apparatus, the user can precisely determine the state of the apparatus and the cause of the abnormality for a short time.

It is a yet further object of the present invention to provide a system of operating the semiconductor manufacturing apparatus which is arranged to reduce the personnels and the time required to maintain and repair the semiconductor manufacturing apparatus for the purpose of more efficiently operating the apparatus itself.

The foregoing objects are achieved by the semiconductor manufacturing apparatus comprising a main unit of processing raw materials for forming a semiconductor, means of recording information of operations to be executed by the main unit as predetermined data, means of operating the operations of the main unit through the use of the data for simulating the operations, and means of displaying the simulated result.

The foregoing objects are achieved by the diagnosis apparatus of the semiconductor manufacturing apparatus being connected with means of recording the information of operations to be executed by the semiconductor manufacturing apparatus for processing raw materials and forming a semiconductor as predetermined data through communicating facility and having means of displaying the result simulated by the means of operating the operation of the semiconductor manufacturing apparatus through the use of the data for simulating the operation.

Further, the foregoing objects are achieved by a program for a semiconductor manufacturing apparatus having a receiving function of receiving from a supplier of supplying the information of the operations to be executed by the semiconductor manufacturing apparatus for processing raw materials and forming a semiconductor as the predetermined data the data through the communicating facility, a displaying function of displaying the simulated result of the means of operating the operations of the semiconductor manufacturing apparatus through the use of the data for simulating the operation, and a transmitting function of transmitting the result to the supplier.

Moreover, the foregoing objects are achieved by an operating system for the semiconductor manufacturing apparatus having means of receiving from a supplier of supplying the information of the operations to be executed by the semiconductor manufacturing apparatus for processing raw materials and forming a semiconductor as the predetermined data the data through the communicating facility and means of displaying the result simulated by the means of operating the operations of the semiconductor manufacturing apparatus for simulating the operations and providing the diagnosis result of the semiconductor manufacturing apparatus based on the result simulated on the received data in response to the request given from the user of the semiconductor manufacturing apparatus.

The foregoing objects are achieved by the data including the information at a time when an abnormality occurs in the semiconductor manufacturing apparatus and the means of simulating the operation where the abnormality occurs of the semiconductor manufacturing apparatus.

Other objects, features and advantages of the invention will become apparent from the following description of the embodiments of the invention taken in conjunction with the accompanying drawings.

DESCRIPTION OF THE EMBODIMENTS

Hereafter, the description will be oriented to the semiconductor manufacturing apparatus and its remote operating system according to the embodiments of the present invention with reference to the appended drawings.

Figure 1:
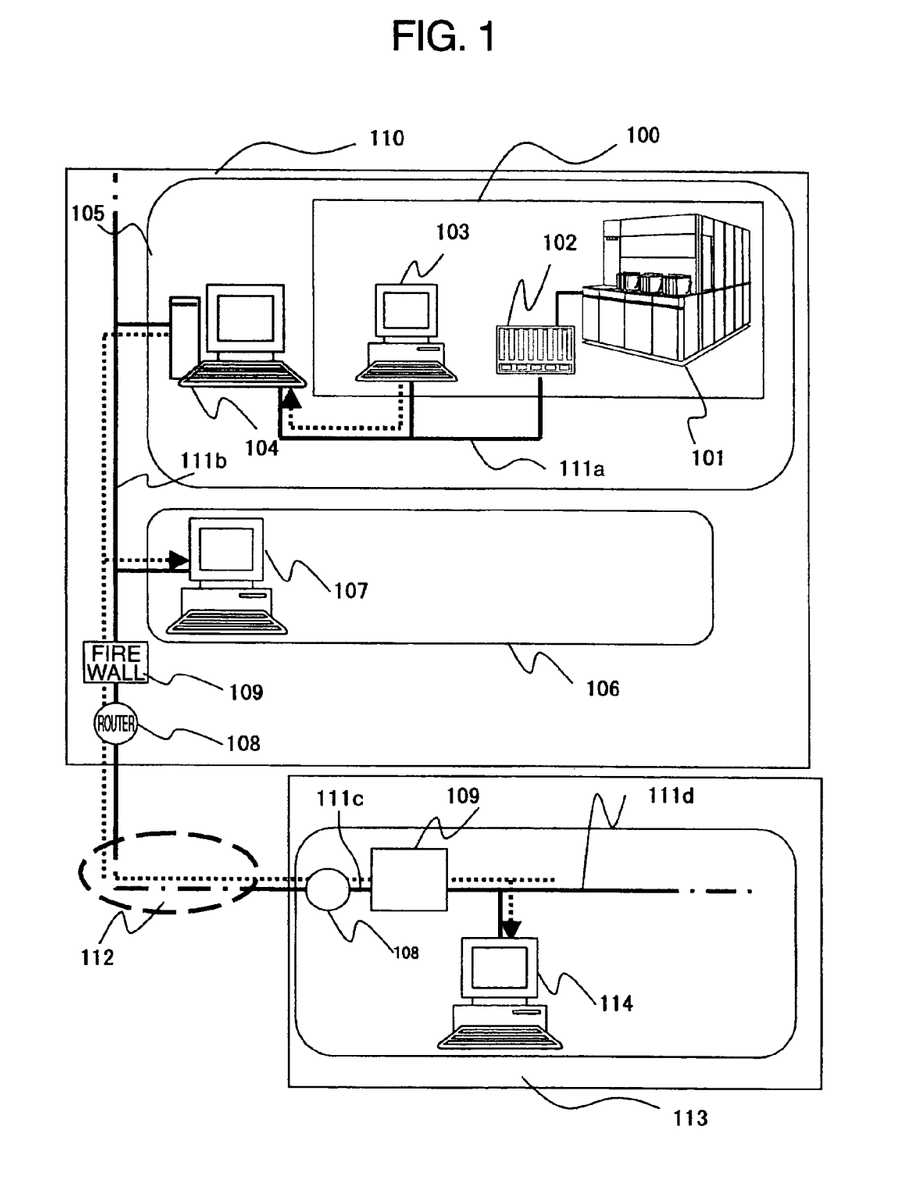
FIG. 1 is a concept view showing a system according to an embodiment of the present invention.

FIG. 1 is a schematic view illustrating an arrangement of a semiconductor manufacturing apparatus and its remote operating system according to the embodiments of the invention.

A reference number 100 denotes a semiconductor manufacturing apparatus according to the embodiment of the invention, which includes a main unit 101 which is a sample processing apparatus for processing a sample in the form of a semiconductor wafer in at least one processing chamber thereof, an apparatus control microcomputer 102 served as a control unit for this apparatus and being connected with the main unit 101, and an operation terminal (such as a computer or a personal computer or a workstation etc.) 103 served as facility for inputting commands for the operation of the main unit 101 and being connected with the microcomputer 102 through a communicating arrangement. The place in which the semiconductor manufacturing apparatus 100 is to be installed is, for example, a clean room 105 located in a business office (factory) 110.

In the clean room 105 is located the apparatus operating terminal 103 that is one of servers of an operating system of the semiconductor manufacturing apparatus. The apparatus operating terminal 103 is connected with an operation recording (log) terminal 104 served as saving the recording information of the operation executed by the client apparatus through a communicating arrangement 111a served as doing communications according to a communication protocol like TCP/IP. The apparatus operation recording terminal 104 is served to receive the information of the operation of the apparatus sent from the terminal 103 and then to record the information in a recording unit built therein (though it is not disclosed). The information of this operation includes an operation having been executed by the apparatus, an output of a sensor located in the apparatus, a transfer of information or commands inside of the apparatus or between the inside and the outside thereof, the information on the process or the routine having been executed by the apparatus, and the time when they take place, all of which are stored in a related manner. For example, the output of the sensor is related with the time information so that the output of the sensor may be picked up as the time series data. In place, plural kinds of data items to be intended by the user are combined with one another for composing one data and may be displayed as a graph when these data items are stored. These kinds of information are saved as a log of the apparatus.

In this embodiment, while the apparatus is in operation, the information of the main unit 101 is continuously obtained, communicated and stored at predetermined intervals. The unit for saving and recording the operation log of the apparatus may be not only the terminal 104 for recording the operation of this apparatus but also the apparatus operating terminal 103 that is a part of the semiconductor manufacturing apparatus or a recording medium like a magnetic disk or a magnetic tape located in the apparatus. The operation recording terminal 104 of the apparatus is provided to be connected with a communicating arrangement 111b like an LAN (Intra-net) distributed in the factory 110 so that the terminal 104 may be communicated with a remote diagnosing terminal 107 that is located in a place (for example, an office of a maintenance, repair section of an enterprise that is a user of the apparatus) located remotely from the factory.

Further, this remote diagnosing terminal 107, the microcomputer 103 for controlling the semiconductor manufacturing apparatus, and the operating terminal 103 are connected with a communicating arrangement like a wide area network (WAN) through the communicating arrangements 111a, 111b, 111c and 111d. Throughout the network having these components connected therewith like the wide area communication network 112, the semiconductor manufacturing apparatus is manufactured and then supplied to the buyer (or user) enterprise. The remote diagnosing terminal 107 may be communicated with a remote diagnosing terminal 114 for the supplier located in an office 113 on the side of the apparatus supplier.

As described above, the semiconductor manufacturing apparatus or its operating system according to this embodiment of the invention includes the communicating arrangements 111a, 111b and network 112 and terminal operating units 102, 103, 104, 107, 114 connected with one another by these communicating arrangements and networks and located remotely from the apparatus. The apparatus or its operating system enables to transfer information between the terminal operating units through the communicating arrangements and networks so that the user located remotely from the apparatus may issue the information on the state or the abnormality of the apparatus or the commands to the apparatus or receive them by communication arrangement.

In the following, the description will be oriented to the method of determining the cause of an abnormality like an error through the use of the remote diagnosing terminal 107 installed in the factory office 106 if the abnormality occurs in the semiconductor manufacturing apparatus 100 located in the clean room 105 of the factory 110 where the apparatus is installed.

In a case that the abnormality, for example, an error is detected in the semiconductor manufacturing apparatus, if the cause of an error occurrence is not clear, the personnel in charge of maintaining the apparatus 100 determines the cause of the error through the use of the operating system of this embodiment by using the remote diagnosing terminal 107 located in the office 106 of the factory 110. The present invention may be used for not only a normal error but also a malfunction such as stoppage of the apparatus by an unclear factor.

The personnel in charge of maintaining the apparatus located in the factory 110 that is the user of the apparatus receives the operation information of the apparatus saved in the apparatus operation recording terminal 104 through a LAN (such as, Intra-net) served as the communicating arrangement 111b according to the TCP/IP protocol or NetBUEI protocol in an FTP or file sharing mode and saves it in the remote diagnosing terminal 107. The information is recorded and saved on the recording medium such as a memory or a magnetic disk. As noted above, the information recorded on the recording medium of the operation recording terminal 104 includes as the operation information of the apparatus the state of an I/O unit of the apparatus, the state of a cassette for accommodating a semiconductor wafer, located in the apparatus, errors, and events taking place in the apparatus. The saving place may be a recording unit with a removable medium such as a flash memory, a small-sized magnetic disk or a removable disk.

When the file of the apparatus log is received and saved in the remote diagnosing terminal 107, the operating status of the semiconductor manufacturing apparatus may be reproducibly simulated on the remote diagnosing terminal through the use of the information of the apparatus log file. In this embodiment, the user of the apparatus enables to display on screen of the terminal operating unit the state of each I/O, the state of loading a wafer in a cassette, the conveying state of a wafer, the desirous information, and so forth from the information of the apparatus log file through the use of the software composing the remote monitoring system (remote monitor software), reproduce the operation of the semiconductor manufacturing apparatus, and visually presenting the operation of the apparatus as the information to the user of the apparatus.

In this embodiment, the operation log file of this apparatus leaves the operating history of the apparatus, which includes the I/O information and the error information of the apparatus, for example. This operation log of the apparatus is scanned by the remote monitor software served as the apparatus diagnosing software so that the information held in the operation log of the apparatus may be visually displayed. The manufacturer of the apparatus reproduces the operation of the apparatus through the use of this remote monitor software and can get to know the day and the time of an error such as an apparatus trouble or the content of the error. The graphical information display of the I/O closer to the error occurrence and the display of the apparatus event information allows the user of the apparatus or the personnel in charge of maintaining the apparatus or the personnel of the manufacturing enterprise in charge of the concerned apparatus to be diagnosed to presume a defective component or sensor group. Further, the automatic diagnosing function allows a defective component or sensor group that may cause an error to be displayed. Hence, by directly contacting the presumed or specified cause of an unfavorable condition to the service personnel located closest to the apparatus or the maintenance personnel of the semiconductor production factory, the cause can be solved.

Figure 2:
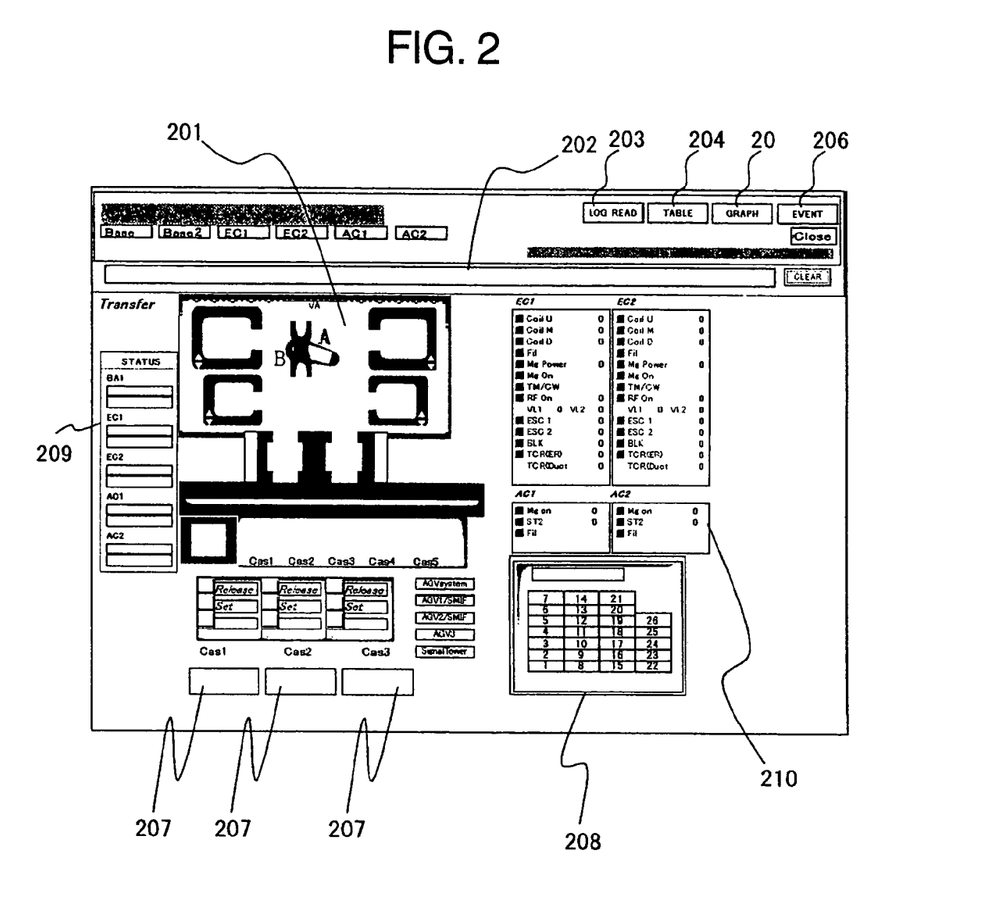
FIG. 2 is a view showing a screen appearing through remote monitor software according to an embodiment of the present invention.

The screen displayed on the monitor located in the remote diagnosing terminal 107 through the software included in the remote monitor is illustrated in FIG. 2. FIG. 2 is a view illustrating the screen displayed on the display unit of the semiconductor manufacturing apparatus and the operating system according to this embodiment shown in FIG. 1.

In FIG. 2, the screen of the remote monitor software is composed of an image view 201 of the main unit 101, a display portion 202 of the error information, the display portion of a sensor state of an output detected by the sensor located in the apparatus, a cassette status display portion 207 of the state of a wafer cassette, a display portion 208 of wafer mapping information, and so forth. As indicated in the place where the wafer is located or the state (operation, location) of the conveying robot or a processing chamber state display area 209, the image view 201 of the semiconductor manufacturing apparatus displays the state of each processing chamber, for example, the presence or the absence of the wafer or each kind of process being executed.

The display portion of the sensor state displays the output from the sensor located in the apparatus, for example, the I/O information of essential units of each processing chamber like the main I/O information display portion 210. Or, by selecting a graph depicting screen display button 205, the output data of the sensor is displayed as a time series graph. The cassette state display portion 207 displays the presence or absence of loading a cassette or the state of a cassette platform. Further, the wafer mapping information display portion 208 displays mapped information of each wafer inside of the cassette loaded in the cassette platform, for example, the number of wafers and the presence of absence of a wafer at each step.

Figure 4A:
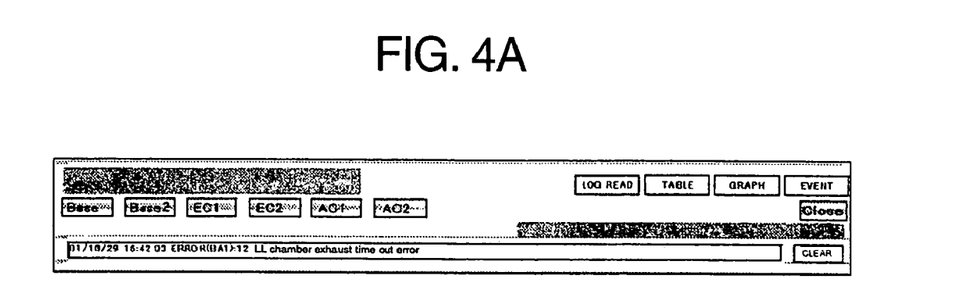
FIGS. 4A and 4B are views showing an error display screen appearing on a remote monitor software screen.
Figure 4B:
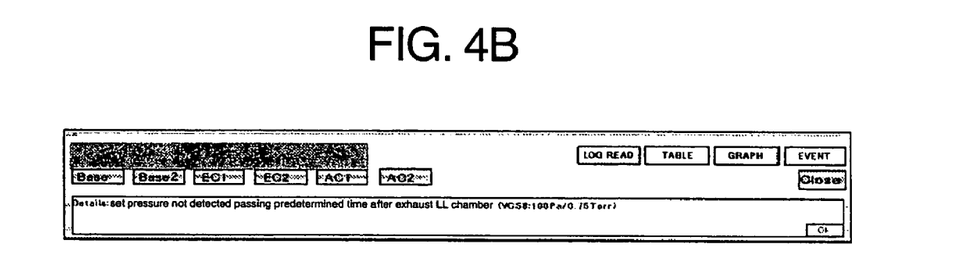

FIGS. 4A and 4B show an example of an error of an error display portion displayed while the operation of the apparatus is reproduced, included in the remote monitor software served as the remote diagnosing unit of this embodiment. FIG. 4A shows the error display portion 201 shown in FIG. 2. The error display column of this figure shows a day and a time of an error detection, an error code, an error type, and so forth, the use of which allows the user of the diagnosis means to display the cause on which the error is determined. In place, by selecting the display column with a pointer of a mouse, the detailed information on the error may be displayed. FIG. 4B shows the detailed information of the error.

As described above, the supply of the detailed information makes it possible to more minutely analyze and diagnose the abnormality. It is preferable that the error content and the detailed message are the same as the message content taking place in the apparatus. According to this embodiment, in response to the occurrence of the abnormality, the user of the apparatus and the personnel in charge of managing and maintaining the apparatus enable to select the information to be displayed in consideration of the range of the abnormality taking place in the apparatus.

Figure 5:
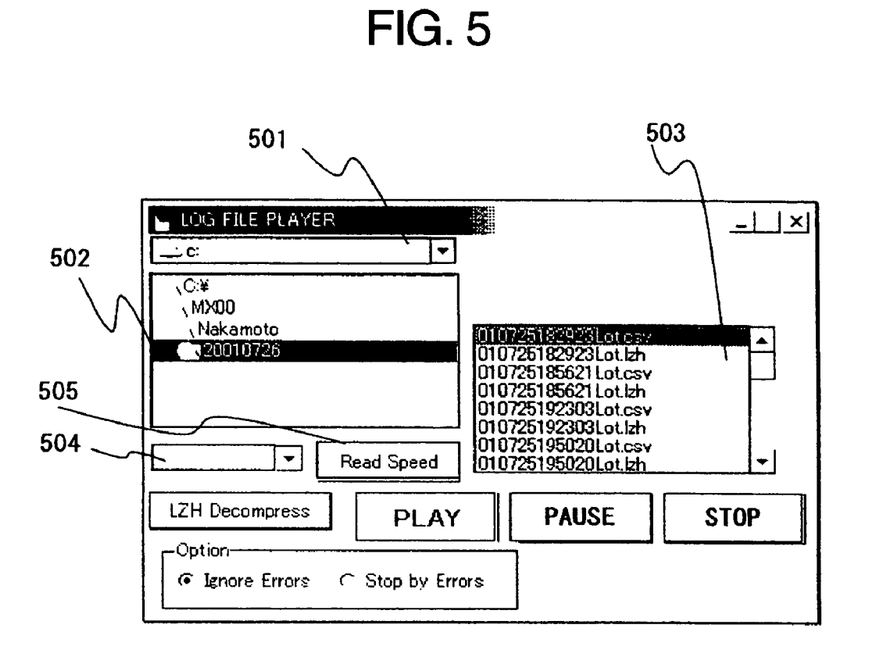
FIG. 5 is a view showing a screen on which an apparatus log is selected.

FIG. 5 shows a screen composition on which the apparatus log file to be reproduced is selected on the remote monitor software. As shown in FIG. 5, on the screen of this embodiment are displayed a device display window 501 for selecting a storage unit like a magnetic disk on which the log file is stored, a file system display window 502 on which a location on the file system stored in the selected storage unit is selected, and a file list display window 503 on which a log file list on the file system is displayed. By using a screen pointer like a mouse on the windows and the boxes, it is possible to select the target storage unit or file.

According to this embodiment, by selecting the saved apparatus log file and selecting a button of "PLAY" displayed in the lower portion of the screen, in response to the information of the abnormality, the user enables to specify the log file to be displayed for allowing the user to determine the cause and select the information to be displayed. The log file of the selected apparatus is read by the remote monitor software. As the information included in the log file is being read, the information is displayed on the screen shown in FIG. 2. Further, this reproducing function has a capability of changing a reproducing speed by pressing a read speed change button after selecting the speed by the read speed selecting list box. Further, the reproducing function also has a function of reproducing the information from any location of the apparatus log file. The read of the selected log file is temporarily stopped by selecting the "PAUSE" button, and by selecting the "STOP" button, the read of the file can be stopped.

The log file of the apparatus is allowed to be edited by the predetermined software if the log file is described according to the predetermined rules. For example, it is possible to change the condition of the apparatus described in any log file, store the changed condition as a new log file, and put the new log file into the remote monitor software. This allows the operation of the apparatus to be simulated under the different condition from the actual apparatus.

The apparatus log file includes the information of an error taking place in the semiconductor manufacturing apparatus 100, so that the content and the occurrence timing of the error taking place in the semiconductor manufacturing apparatus may be reproduced and displayed. This reproduction makes it possible for the user to clearly grasp the content and the cause of the error, so that the personnel in charge of maintaining and repairing the semiconductor manufacturing apparatus, who is notified of the occurrence of the error at a remote place from the apparatus, can precisely determine the state of the apparatus and the cause of the abnormality.

Further, the personnel in charge of managing, maintaining or repairing the apparatus at a remote place has to often determine the state of the apparatus or the cause of the abnormality in response to the notice of the abnormality a certain length of time later than the occurrence of the abnormality. A certain length of time later, the state or the condition of the abnormality-caused apparatus is often changed. In the arrangement of this embodiment, in some cases, the state or the condition of the abnormality-caused apparatus may be reproduced and displayed on the software. This makes it possible for the personnel to determine the state of the apparatus on or before and after the abnormality occurrence and the cause of the abnormality more precisely than the conventional arrangement.

As a condition in which the reproduction is executed as shown in the lower portion of FIG. 5, it is possible to select the stop of the reproduction when an error occurs, that is, the stop of the apparatus on the software or the nonstop of the reproduction when an error takes place. By selecting either one of them according to the presumed cause, it is possible to more precisely and quickly determine the state of the abnormality-caused apparatus and the cause of the abnormality.

In order to determine the state of the abnormality-caused apparatus and the cause of the abnormality, for more precisely determining them, it is advantageous to verify the operation of the apparatus and the occurrence of the abnormality or verify it as changing the condition. However, this type of semiconductor manufacturing apparatus often has difficulty in operating the apparatus again after the abnormality takes place. For example, since the apparatus is stopped when the abnormality takes place, a relatively long time is required until the apparatus is started again after preparing the conditions such as a processing gas, a power supply, and an apparatus temperature. Moreover, if the abnormality may damage the apparatus, the restart of the apparatus may impair the apparatus again. This embodiment allows the operation of the abnormality to be reproduced and displayed on the software and to be repeated. This makes it possible to prevent the damage from being brought about and reduce the time taken until the restart of the apparatus, thereby more precisely and quickly determine the state of the apparatus and the cause of the abnormality. By simulating the operation in the case of operating the apparatus under another condition, the actual abnormality operation can be displayed, thereby the operator more precisely and quickly determine the cause of the abnormality.

Figure 6:
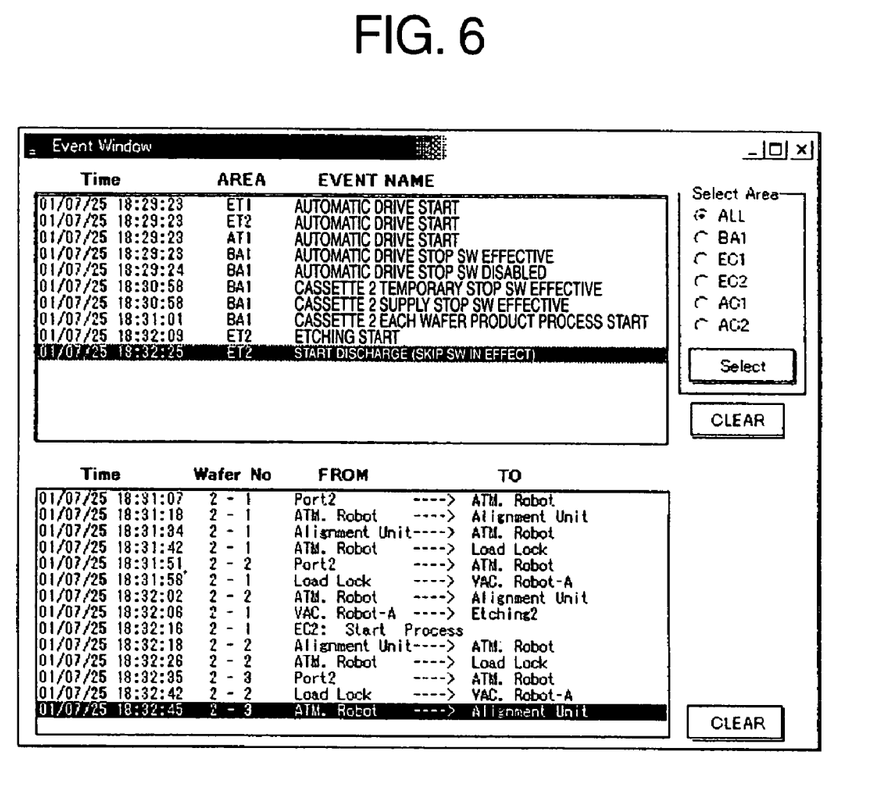
FIG. 6 is a view showing a screen on which an apparatus event is displayed.

Further, the remote monitor software has a function of displaying the information on the movement of the wafer inside the semiconductor manufacturing apparatus or the information on various events of the apparatus as shown in FIG. 6. On the display area are displayed an occurrence day and time of each kind of event, an occurrence location, and an event name. On the area of displaying the information on the wafer movement are displayed an occurrence day and time, a number of a moved wafer, and a moving start point and an end point of a wafer. The information of each kind of event includes a function of selecting the occurrence location and displaying only the event of the selected location.

This makes it possible to grasp the history of the movement of the wafer, the operation of the apparatus by an operator, and so forth.

Figure 7:
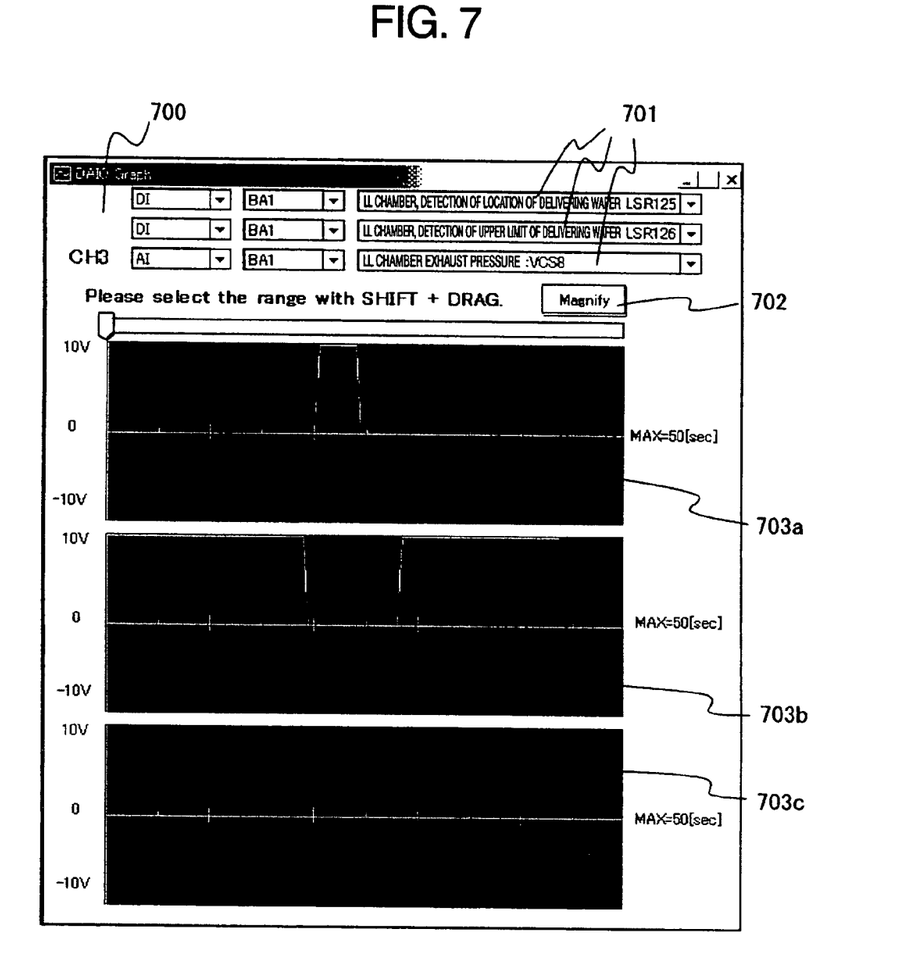
FIG. 7 is a view showing a screen on which a graph is depicted.

In order to specify the location where an error occurs, according to this embodiment, the remote monitor software includes a window on which the I/O information of the apparatus is depicted as a graph as shown in FIG. 7. FIG. 7 shows the screen of the graph of the I/O information of the apparatus, depicted by the remote monitor software shown in FIG. 1. In this figure, a reference number 700 denotes a window on which the I/O data is displayed. A reference number 701 denotes a column in which shown are the title and the operation of the I/O to be displayed. A reference number 702 denotes a button by which the display of each data item is magnified or reduced. Reference numbers 703a to 703c denote displayed I/O data. By selecting the magnify and reduce button 702, the graph of the I/O information may be magnified or reduced. Since a plurality of pieces of I/O information are displayed at a time and the log is stopped and the depiction of the graph is also stopped at a time when an error occurs, the I/O information at a moment when the error occurs may be displayed. In order to easily select the I/O information for displaying the information as a graph, it is possible to select, retract or restrict the type of the I/O (analog or digital) and the location where the I/O information to be displayed belongs.

As described above, according to this embodiment, the outputs from a plurality of sensors are allowed to be displayed at a time for the same period. Hence, the user can compare the different data items with each other. Further, the I/O data at a time when the abnormality occurs is displayed. In particular, when the phenomenon determined to be the abnormality takes place, the display of the data is stopped. Hence, the user focuses his attention on the data in which the abnormality and the phenomenon determined to be its cause takes place before and after the abnormality occurs, so that the user can more quickly and precisely grasp the cause of the abnormality and the state of the apparatus. In order to magnify the specific period on the display, the user can more minutely grasp the state of the apparatus, so that the user also can more accurately determine the cause.

Figure 8:
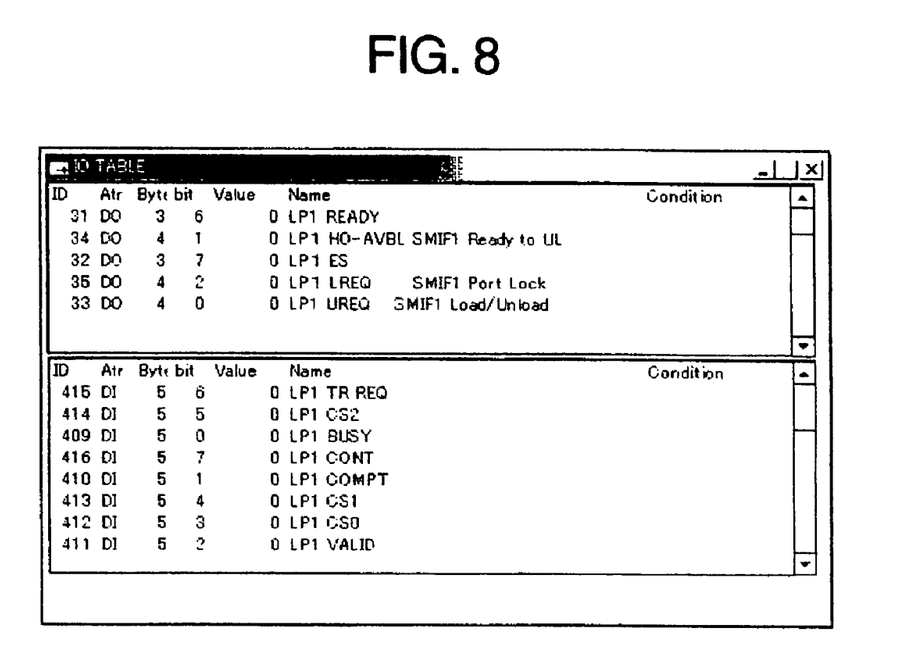
FIG. 8 is a view showing a screen on which an I/O table is displayed.

Moreover, the remote monitor software allows the I/O information of the apparatus, the digital I/O or the analog I/O, to be displayed according to each component or function of the apparatus as shown in FIG. 8. This window is called an I/O table. The I/O table is roughly divided into a display area of an output signal from the apparatus and the other display area of an input signal into the apparatus. Further, this I/O table is composed of the descriptions of an I/O type (analog or digital), a proper number of the I/O information, a value of the I/O information, a title of the I/O information, and a value of the I/O information.

Figure 9:
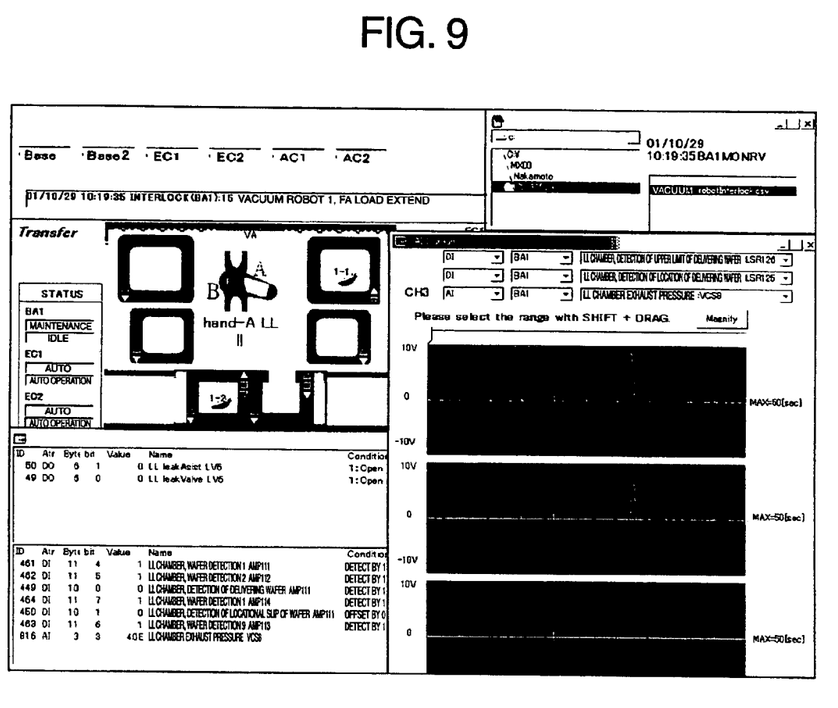
FIG. 9 is a view showing plural screens overlapped with one another.

The remote monitor software for diagnosing the apparatus at a remote location, as shown in FIG. 9, has a function of displaying a screen for showing each operation (event) of the apparatus shown in FIG. 6, a graph screen of the sensor outputs of the apparatus shown in FIG. 7, and the screen for displaying the I/O states shown in FIG. 8 on the screen shown in FIG. 2 at a time. It also has a function of erasing, minimizing or hiding an unnecessary screen behind the screen. These functions allow the informations displayed on the plural screens to be cited on the same screen and the operation of the apparatus to be evaluated or studied as comparing the change taking place as the same or different log files are being read or the operation is being reproduced. This thus makes it possible to more accurately and quickly determine the cause of the abnormality and the state of the abnormality-caused apparatus. As a result, the informations such as the measures against the cause of the abnormality of the apparatus such as a process routine, a condition change, an operation of the apparatus, and a maintenance routine may be notified to the personnel in charge of operating the apparatus or maintaining the apparatus through the communicating arrangements and network.

Further, the information on the cause of the abnormality determined in the apparatus or the measures against the abnormality is stored in the storage unit connected with the specific terminals (for example, the terminals 103, 104 and 107) so that the information may be viewed on the display. When the abnormality is detected later, the information may be used for determining the cause of the abnormality or the measures against it so as to accurately and quickly grasp the state or the cause of the abnormality.

In the foregoing description, the remote monitor software has been used in the case that in the factory site where the semiconductor manufacturing apparatus is installed, the apparatus installed place (like a clean room) is remote from the personnel in charge of checking and determining the state and the cause of the apparatus (who is at the office). This case holds true to the case that the place where the personnel in charge of maintaining and repairing the apparatus is in one building and the place where the apparatus is installed is in another building in the same factory site or the former is on one floor and the latter is on another floor in the same building. The function and the effect of the semiconductor manufacturing apparatus or the operating system according to the forgoing embodiment may be effective even in the case that the place where the personnel in charge of maintaining the apparatus or determining the cause of the abnormality and taking the measures against it, for example, the office of the enterprise of supplying and installing the apparatus or maintaining the apparatus is located out of and far away from the factory site where the apparatus is installed so that a considerably long time is taken between both of the places but the terminals located in respective places are connected in a wide area network. Hereafter, the description will be oriented to the use of the operating system by the supplier with reference to FIG. 1.

In a case that the manufacturer or the supplier of the semiconductor manufacturing apparatus 110 is notified of the occurrence of an abnormality such as an error or a malfunction of the apparatus by the factory 110 or the enterprise where the apparatus is installed or the personnel in charge of managing or maintaining the apparatus or the section or another enterprise in charge of such services, the remote monitor software composing the remote diagnosis operating system is used for determining the state or the cause of the abnormality in the place far away from the apparatus installed place, for example, the office of the supplier or the office in which the personnel in charge is located.

For example, the remote diagnosing terminal 114 located on the side of the supplier is communicated with the semiconductor manufacturing apparatus 100 installed in the factory 110 through a wide area network like the internet and an in-site communication arrangement 111c so that the terminal 114 may receive the operation record (log file) of the apparatus containing the record of the operation at a time when the abnormality has occurred. The in-site communicating arrangement 111c of the apparatus user provides a router 108 for communicating with the wide area network 112. For example, the log file stored or recorded in the storage unit located in the operation recording terminal 104 of the semiconductor manufacturing apparatus 100 is communicated with the terminal 114 so as to receive the log file from the terminal 104. The storage unit may be located outside the apparatus 100, for example, in the office 107 of the factory 110 or the remote diagnosis terminal 107 of the apparatus user.

In this case, the communication security facility is required to be provided so that the information of the content included in the log file of the apparatus is not made open to the third party. Between the wide area communication network 112 and the in-site communication arrangement 111c of the apparatus user or the in-office communication arrangement 111d of the apparatus supplier is located means of restricting the communication between the outside and the inside of the factory 110 or the office 106 such as a firewall 109. Since the wide area communication network like the internet is a public network, the security has to be secured by the VPN (Virtual Private Network), for example. Instead, the information itself may be encrypted by means of the public key encrypting system or the common key encrypting system.

Moreover, the operation record of the semiconductor manufacturing apparatus 100 is recorded in the specific terminal and the storage unit provided to be communicated therewith so that the terminals 103, 104 and 107 in the factory 110 or the office 106 on the side of the apparatus user may receive and view or display the apparatus log file through the communication arrangements and network. In this case, for restricting the public view of the information in the log file, it is possible to adopt the technology for securing the foregoing security. Moreover, the terminal for recording the operation of the apparatus is provided in the office 113 on the side of the apparatus supplier so that the operation record stored in the storage unit of the terminal 104 by which operation of the apparatus is directly recorded in a short period on the side of the apparatus user may be received at predetermined intervals for the purpose of allowing the terminal 114 of the apparatus supplier to store the substantially same operation record as the terminal 104 of the apparatus user. Likewise, the information on the cause of the abnormality and the measures against it may be stored in the specific terminal or the storage unit to be communicated therewith so that the information may be viewed on the terminal.

After obtaining the apparatus log file, the supplier of the semiconductor manufacturing apparatus enables to reproducibly simulate the operation of the apparatus from the log file of the apparatus in which the abnormality occurs through the use of the remote monitor software in the office 113 on the user side. The supplier enables to determine the cause of the abnormality, the place where the abnormality occurs, and so forth from the reproduce apparatus operation or the state of the apparatus recorded in the log file.

Through the use of the semiconductor manufacturing apparatus and the operating system described in this embodiment, both the user and the supplier of the semiconductor manufacturing apparatus may diagnose the apparatus or determine the cause or the state of the abnormality in concert even if they are far away from each other.

Moreover, the semiconductor manufacturing apparatus and the operating system may be also arranged to store the record of the operation of the log file of a plurality of semiconductor manufacturing apparatuses and share the relation among the state of the abnormality and the determined cause and state or the information on the measures against it among these semiconductor manufacturing apparatuses or to distribute the information among a plurality of apparatus users through the communication arrangements and network.

This arrangement makes it possible for one user who uses the same type of apparatus according to the same procedure to use the information on the abnormality occurring in another user's apparatus for maintaining or checking the apparatus. This results in preventing the stoppage of the apparatus by the occurrence of the abnormality and thus the lowering of the production efficiency of the semiconductor and improving the working efficiency of the semiconductor manufacturing apparatus, thereby reducing the manufacturing cost of the semiconductor device.

Figure 3:
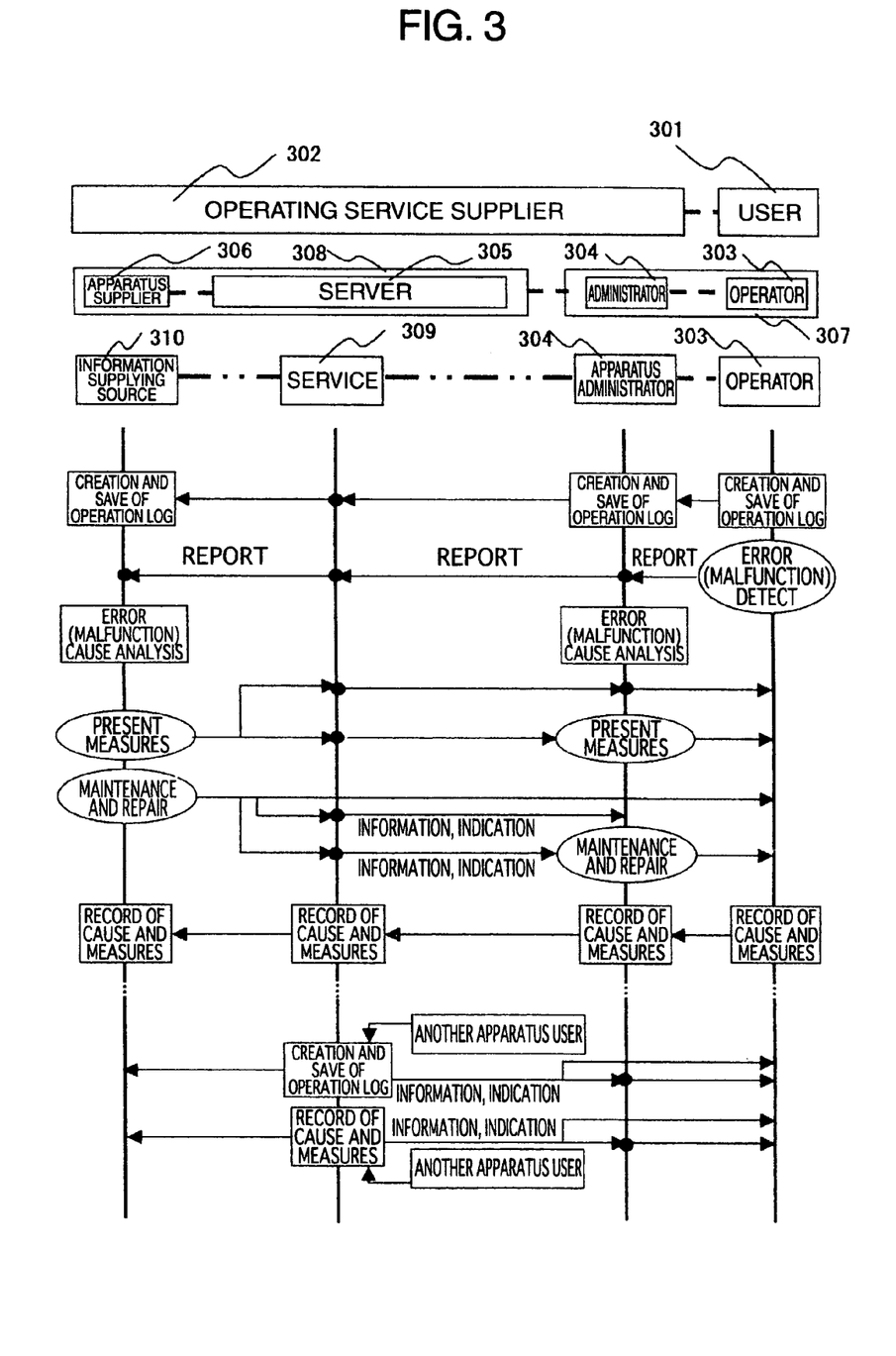
FIG. 3 is a schematic view showing an operating system of a semiconductor manufacturing apparatus according to an embodiment of the invention.

In turn, the description will be oriented to the flow of the foregoing operating system of the semiconductor manufacturing apparatus according to the present invention with reference to FIG. 3. FIG. 3 shows the schematic view of the semiconductor manufacturing apparatus and the flow of the operating system thereof according to the present invention. FIG. 3 illustrates the relation between the place like an enterprise or a factory where the apparatus is installed and the enterprise of maintaining or repairing this apparatus and supplying the operating service. In this figure, the participants of this operating system includes an apparatus supplier 306 who designs and manufactures the semiconductor manufacturing apparatus and supplies and installs it, an operator 301 who operates the apparatus in the place like a clean room where the apparatus is installed, an administrator 304 who maintains and manages the apparatus in the apparatus installed place, and a server 305 who supplies the information required for operating the apparatus to the supplier side and the user side.

These participants may be roughly divided into the apparatus user 301 and the supplier 302 of the operating service of the apparatus or the apparatus installed place 307 like a factory and an external operating service supplier 308 who supplies the operating service of the apparatus remotely from the place 307. Further, they may be also divided into an information supplying source 310 for supplying the advice on the operation of the apparatus and the measures, and a service supplier 309 who collectively supplies the information of this apparatus, for the apparatus administrator (manager) 304. The server 305 may be not only a single enterprise but also an enterprise of relaying plural communications or a plurality of relays who connect an information supplier (information server) 309 with an apparatus supplier 306 and the apparatus administrator 304 so that the information on the operation of the apparatus and the occurrence of the abnormality may be obtained if necessary and a same information might be obtained, or shared among user and service supplier.

The flow of this operating system is recorded in the storage unit provided in the apparatus in the predetermined data format as the operator 301 of the apparatus starts the apparatus. The resulting data is made to be an apparatus log file. Further, as noted above, this operation information is communicated with the terminal or the storage unit of the administrator 304 of the apparatus located in a remote place (like an office) from the apparatus itself through the communication facility and then is recorded therein. The information may be recorded in the terminal or the storage unit located in a residence or an office of the apparatus supplier 306 or the information relay 305 or the information server 309.

While the apparatus operator 303 is operating the apparatus, if an abnormality like an error or an unfavorable condition takes place, this occurrence is notified to the apparatus administrator 304, the apparatus information server 309, and the apparatus supplier 306 (apparatus information supplier source 310) through the communication facility.

When the abnormality is reported, the apparatus administrator 304, the apparatus supplier 306 or the apparatus information supplier 310 may obtain the apparatus operation information (apparatus log file) from each recording place through the communication facility or the like. When the operation record is obtained, the apparatus supplier 306 and the information source 310 operate to determine the cause of the abnormality or the state of the apparatus through the use of the foregoing remote diagnosing means and then present the measures against the cause based on the determined result. The presented measures are supplied to the information server 309 or the apparatus administrator 304 or directly sent to the apparatus operator 303. The use of the measures makes it possible for the apparatus administrator 304, the operator 303 or the apparatus supplier to directly repair or adjust the apparatus. Upon termination of it, the information on the cause and the measures composed as the predetermined data by corresponding the cause with the measures on the side of the apparatus operator 303 is recorded in the recording unit or the like provided in the apparatus, for example. The information on the cause and the measures is transmitted to the apparatus administrator 304, the apparatus information server 309 and the apparatus supplier 306 (apparatus information source 310) and then is recorded therein.

This makes it possible to share the information on the apparatus among the participants of the operating system by transmitting and receiving through communication means. If one of the participating apparatuses suffers from an abnormality or the information on the apparatus like the procedure or the condition is updated, that is, the accurate and quick response is required, it is possible to prevent the occurrence of the apparatus abnormality and reduce the stopping time of the apparatus and the so-called rising time between the start of the apparatus and the stable operation thereof, thereby improving the operating efficiency of the apparatus.

As another arrangement, the information on the operation from another apparatus user may be obtained from the apparatus information server 309. For example, if the apparatus of another user suffers from an abnormality and the cause and the measures against it are presented, the information on the content of the abnormality, the determined cause and its measures may be distributed if required and obtained from the server 309. This arrangement makes it possible to use the information on the apparatus operated by another user for preventing or restricting, restraining the possible abnormality caused in the apparatus of the user 301.

Figure 10:
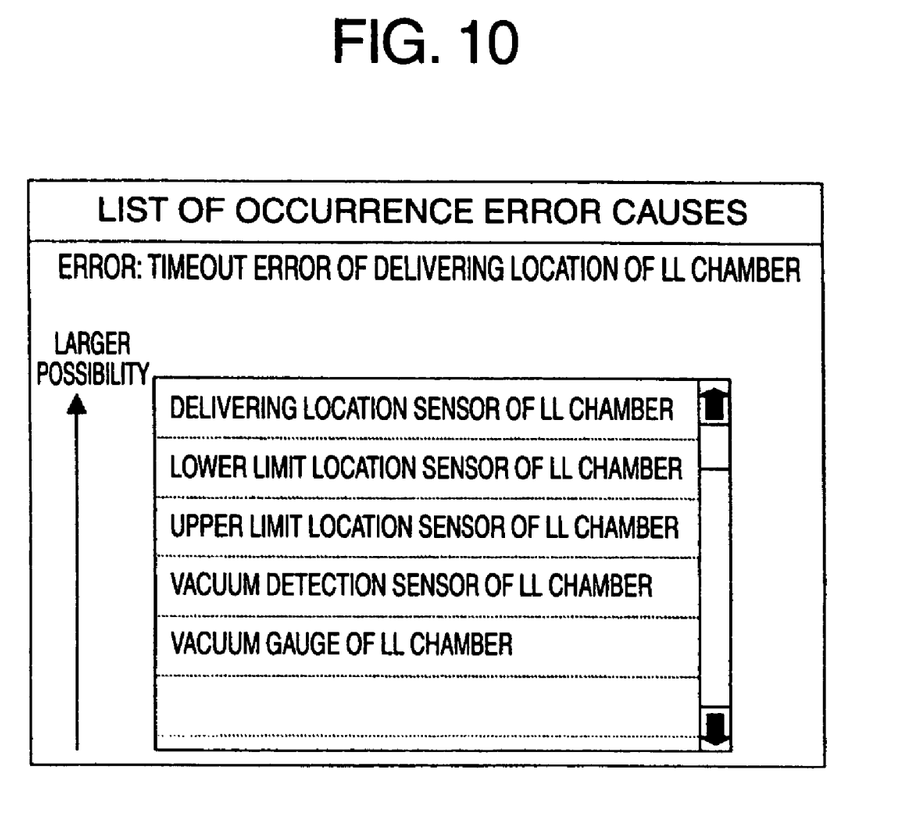
FIG. 10 is a view showing a screen on which a list of error cause candidates are displayed.

FIG. 10 illustrates the screen on which the cause of an error is presumed if the semiconductor manufacturing apparatus suffers from an error. The causes of the errors occurring in the apparatus are listed in the higher occurrence possibility order by using the sensor names, for example. The list of the data in the higher occurrence possibility order means a error-to-cause list composed for each error in advance or another type of list having been composed to a certain extent. The latter list may be saved as its possibility order is automatically changed by manually registering the cause for each error.

According to the embodiment of the invention, the semiconductor manufacturing apparatus and its diagnosis apparatus and an operating system thereof are arranged to allow the user to accurately determine the state of the apparatus and the cause of the abnormality for a short time.

Further, the semiconductor manufacturing apparatus and its diagnosis apparatus and an operating system thereof are arranged to accurately determine the state of the apparatus and the cause of the abnormality for a short time if the user is located remotely from the apparatus.

Moreover, the operating system of the semiconductor manufacturing apparatus is arranged to reduce the cost for the skilled personnels and the time required to maintain and repair the semiconductor manufacturing apparatus, thereby more efficiently operating the apparatus.

It should be further understood by those skilled in the art that the foregoing description has been made on embodiments of the invention and that various changes and modifications may be made in the invention without departing from the spirit of the invention and the scope of the appended claims.

What is claimed is:

1. A sample processing apparatus comprising:
a main unit comprising at least one processing chamber in which a sample is disposed and processed;
a recording device which records information of an operation in the main unit as predetermined data, the recording device records information including a plurality of time sequence data corresponding to signals concerned with operations of a plural portions of the main unit which are output during the operation of the main unit; and
a display unit which displays at least one information selected by an user from among the information recorded as the predetermined data in the recording device and an information about an abnormality occurred during the operation of the main unit, wherein both the information selected by the user and the information about the abnormality is displayed on the display unit synchronously.

2. A sample processing apparatus according to claim 1 wherein the recording device records information concerned with the abnormality involving content and timing data.

3. A sample processing apparatus according to claim 2 wherein the display unit displays a part of the information designated by the user from among the information recorded in the recording device.

4. A sample processing apparatus according to claim 2 wherein the display unit displays a part of the information corresponding to a period designated by the user from among the information recorded in the recording device.

5. A sample processing apparatus according to claim 1 wherein the recoding device records information concerned with the abnormality involving content and timing data, and information including a plurality of time sequence data corresponding to signals concerned with input to or output from a plural portions of the main unit.

6. A sample processing apparatus according to claim 5 wherein the display unit displays a part of the information designated by the user from among the information recorded in the recording device.

7. A sample processing apparatus according to claim 5 wherein the display unit displays a part of the information corresponding to a period designated by the user from among the information recorded in the recording device.

8. A sample processing apparatus according to claim 1 wherein the display unit displays a part of the information designated by the user from among the information recorded in the recording device.

9. A sample processing apparatus according to claim 1 wherein the display unit displays a part of the information corresponding to a period designated by the user from among the information recorded in the recording device.

10. A sample processing system comprising:
a sample processing apparatus located at a business location, the sample processing apparatus including:
a main unit comprising at least one processing chamber in which a sample is disposed and processed;
a recording device which records information of an operation in the main unit as predetermined data, the recording device records information including a plurality of time sequence data corresponding to signals concerned with operations of a plural portions of the main unit which are output during the operation of the main unit; and
a display unit which displays at least one information selected by an user from among the information recorded as the predetermined data in the recording device and an information about an abnormality occurred during the operation of the main unit, wherein both the information selected by the user and the information about the abnormality is displayed on the display unit synchronously, and
an off-site display unit which displays at least one information selected by an off-site user from among the information recorded as the predetermined data in the recording device and an information about an abnormality occurred during the operation of the main unit, wherein both the information selected by the off-site user and the information about the abnormality is displayed on the off-site display unit synchronously.

11. A sample processing system according to claim 10 wherein the recording device records information concerned with the abnormality involving content and timing data.

12. A sample processing system according to claim 11 wherein the display unit displays a part of the information designated by the user from among the information recorded in the recording device.

13. A sample processing system according to claim 11 wherein the display unit displays a part of the information corresponding to a period designated by the user from among the information recorded in the recording device.

14. A sample processing system according to claim 10 wherein the recoding device records information concerned with the abnormality involving content and timing data, and information including a plurality of time sequence data corresponding to signals concerned with input to or output from a plural portions of the main unit.

15. A sample processing system according to claim 14 wherein the display unit displays a part of the information designated by the user from among the information recorded in the recording device.

16. A sample processing system according to claim 14 wherein the display unit displays a part of the information corresponding to a period designated by the user from among the information recorded in the recording device.

17. A sample processing system according to claim 10 wherein the display unit displays a part of the information designated by the user from among the information recorded in the recording device.

18. A sample processing system according to claim 10 wherein the display unit displays a part of the information corresponding to a period designated by the user from among the information recorded in the recording device.

19. A sample processing method comprising:
disposing and processing a sample at least one processing chamber in a main unit;
recording information of an operation in the main unit as predetermined data, including a plurality of time sequence data corresponding to signals concerned with operations of a plural portions of the main unit which are output during the operation of the main unit; and
displaying at least one information selected by an user from among the information recorded as the predetermined data in the recording device and an information about an abnormality occurred during the operation of the main unit, wherein both the information selected by the user and the information about the abnormality is displayed on a display unit synchronously.

20. A sample processing method according to claim 19 wherein the recording records information concerned with the abnormality involving content and timing data.

21. A sample processing method according to claim 20 wherein the displaying displays a part of the information designated by the user from among the information recorded in a recording device.

22. A sample processing method according to claim 20 wherein the displaying displays a part of the information corresponding to a period designated by the user from among the information recorded in a recording device.

23. A sample processing method according to claim 19, wherein the recoding records information concerned with the abnormality involving content and timing data, and information including a plurality of time sequence data corresponding to signals concerned with input to or output from a plural portions of the main unit.

24. A sample processing method according to claim 23 wherein the displaying displays a part of the information designated by the user from among the information recorded in a recording device.

25. A sample processing method according to claim 23 wherein the displaying displays a part of the information corresponding to a period designated by the user from among the information recorded in a recording device.

26. A sample processing method according to claim 19 wherein the displaying displays a part of the information designated by the user from among the information recorded in a recording device.

27. A sample processing method according to claim 19, wherein the displaying displays a part of the information corresponding to a period designated by the user from among the information recorded in a recording device.

* * * * *